(12) United States Patent
Lu et al.

(10) Patent No.: US 10,964,587 B2
(45) Date of Patent: Mar. 30, 2021

(54) ATOMIC LAYER DEPOSITION FOR LOW-K TRENCH PROTECTION DURING ETCH

(71) Applicant: Tokyo Electron Limited, Tokyo (JP)

(72) Inventors: Yen-Tien Lu, Albany, NY (US); David O'Meara, Albany, NY (US); Angelique Raley, Albany, NY (US); Xinghua Sun, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 16/415,687

(22) Filed: May 17, 2019

(65) Prior Publication Data
US 2019/0355617 A1 Nov. 21, 2019

Related U.S. Application Data

(60) Provisional application No. 62/674,092, filed on May 21, 2018, provisional application No. 62/681,699, filed on Jun. 7, 2018.

(51) Int. Cl.
*H01L 21/768* (2006.01)
*H01L 21/762* (2006.01)
*H01L 21/308* (2006.01)

(52) U.S. Cl.
CPC .... *H01L 21/76802* (2013.01); *H01L 21/3086* (2013.01); *H01L 21/76224* (2013.01)

(58) Field of Classification Search
CPC ......... H01L 21/76802; H01L 21/76224; H01L 21/3086; H01L 21/02164; H01L 21/0217; H01L 21/0228; H01L 21/02274; H01L 21/31116; H01L 21/31144; H01L 21/76237; H01L 21/76816; H01L 21/76822; H01L 21/76831
USPC .......................... 216/62; 438/706–714, 725
See application file for complete search history.

(56) References Cited

U.S. PATENT DOCUMENTS

| 7,338,893 | B2 | 3/2008 | Engbrecht et al. | |
| 2013/0344699 | A1* | 12/2013 | Chiba | H01L 21/76802 438/700 |
| 2015/0311114 | A1 | 10/2015 | Huang et al. | |
| 2016/0099174 | A1* | 4/2016 | Wu | H01L 21/76808 438/618 |

* cited by examiner

*Primary Examiner* — Duy Vo N Deo
(74) *Attorney, Agent, or Firm* — Wood Herron & Evans LLP

(57) ABSTRACT

An atomic layer deposition (ALD) technique is used to deposit one or more layers on hard mask layers and the sidewalls of low-K dielectric trench as part of the trench etch process. The ALD layer(s) can prevent the hard mask from being eroded during various hard mask open processes. Further, the ALD layer(s) may be utilized to prevent the low-K dielectric sidewall from being laterally etched during the low-K dielectric trench etch. Hence, better control of the trench profile and better critical dimension control may be provided.

19 Claims, 8 Drawing Sheets

ATOMIC LAYER DEPOSITION FOR LOW-K TRENCH PROTECTION DURING ETCH

CROSS REFERENCE TO RELATED APPLICATIONS

This application claims priority to U.S. Provisional Patent Application No. 62/674,092, entitled "Atomic Layer Deposition For Low-K Trench Protection During Etch", filed May 21, 2018 and U.S. Provisional Patent Application No. 62/681,699, entitled "Atomic Layer Deposition For Low-K Trench Protection During Etch," filed Jun. 7, 2018; the disclosures of which are expressly incorporated herein, in their entirety, by reference.

BACKGROUND

The present disclosure relates to the processing of substrates. In particular, it provides a method for forming trenches in substrates.

The formation of trenches in substrates has long been known. For example, processing of semiconductor wafers often involves the formation of trenches. In one embodiment, trenches are formed in low dielectric constant (low-K) materials of the substrate. With regard to semiconductor wafers, trench formation in low-K materials conventionally is used during back end of line (BEOL) processing. One use of such trenches is for the formation of vias between metal interconnect lines in a substrate. A wide range of low-K materials may be utilized, including but not limited to, doped silicon dioxides (fluorine, carbon and other dopants), spin-on polymers (including organic and silicon based polymers), porous oxides, etc. all being well-known in the art. Such low-K materials provide a dielectric constant less than silicon dioxide. As used herein, "low-K" includes materials that some may consider to be "ultra-low-K" materials. Thus, "low-K" includes low-K or lower dielectric constant materials.

As the critical dimension (CD) of features formed on substrates continue to shrink, etching trenches continues to become more challenging. Conventional process flows include the use of photolithography processes to form hard masks over a low-K material within which a trench is desired. One exemplary process structure 100, is shown in FIG. 1. As shown in FIG. 1 a metallization layer 105 has been formed in a dielectric layer 110. As shown, a barrier low-k (BLOK) material is provided as indicated by BLOK layer 115. BLOK layers are known in the art to operate as a barrier and etch stop layer. BLOK materials provide a lower dielectric constant than alternative barrier and etch stop layers such as silicon nitride. Over the BLOK layer 115, a low-K dielectric layer 120 (within which a trench will be eventually formed) is provided. Over the low-K dielectric layer 120, a plurality of patterned layers/hard mask layers may be provided. For example, in the embodiment of FIG. 1, a patterned stack of an upper hard mask layer 135 and a metal hard mask layer 130 is provided. For example, in one embodiment the upper hard mask layer 135 may be silicon oxide (SiO2) or silicon nitride (SiN) and the metal hard mask layer 130 may be titanium nitride (TiN). As shown in FIG. 1, the upper hard mask layer 135 and the metal hard mask layer 130 have already been patterned to form a patterned feature. Such patterning may be accomplished by any of a wide range of lithography techniques, all which are well known in the art. A lower hard mask layer 125 underlying the metal hard mask may also be provided as shown in FIG. 1 such that the lower hard mask layer 125 is located under the patterned feature. The lower hard mask layer 125 may be a SiN hard mask in one embodiment.

In conventional processing, as is well known, a plasma process may be used for the etching of the lower hard mask layer 125. However, the metal hard mask layer 130 may be eroded during the etching of the lower hard mask layer 125. Such erosion may lead to larger than desired critical dimensions. An example of this is seen in FIG. 2 where erosion locations 205 illustrate the erosion of the metal hard mask layer 130.

Further, during the trench etch of a conventional process (again a plasma process) the low-K etch process used to etch the low-K dielectric layer 120 may result in the formation of sidewalls which are not substantially vertically straight but rather exhibit undesirable characteristics such as bowing 305, as shown in FIG. 3. Such a shape may result from lateral etching of the low-K dielectric layer 120. Such sidewalls are particularly problematic as critical dimensions shrink. Further, the thin lines of low-K material that remain after etch may result in undesirable line wriggle. Additionally, the sidewalls of the low-K material may exhibit undesirable damage. In one example, the trench etch is utilized so that the trench aligns with the metallization layer 105 for providing electrical connection to the metallization layer 105.

One attempt to address these problems is to utilize hard mask and low-K etch processes which generate high amounts of polymer. Such polymer formation processes may help address the sidewall damage and the bowing profiles. However, generating such polymers typically decelerates the etch rate of the low-K plasma etch such that substrate throughput is negatively impacted.

In one embodiment, it would be desirable to provide an improved trench formation process that addresses at least some of the problems described above. In another embodiment, it would be desirable to provide an improved process for forming trenches in low-K materials.

SUMMARY

In one embodiment, an atomic layer deposition (ALD) technique is used to deposit one or more layers on hard mask layers and the sidewalls of low-K dielectric trench as part of the trench etch process. The ALD layer(s) can prevent the hard mask layer(s) from being eroded during various hard mask open processes. Further, the ALD layer(s) may be utilized to prevent the low-K dielectric sidewall from being laterally etched during the low-K dielectric trench etch. Hence, better control of the trench profile and better critical dimension control may be provided. In one embodiment, the ALD layer(s) may be SiO2 or SiN sacrificial layers. In one embodiment, the hard mask for which erosion control is provided is a metal hard mask. In one embodiment, the method provides erosion control during the etch of an underlying hard mask, which in one embodiment may be a SiN hard mask.

In one embodiment, a method of etching a substrate to form a trench is described. The method may comprise providing a first patterned feature on the substrate and providing a low-k dielectric layer on the substrate, the low-k dielectric layer underlying the first patterned feature. The method may further include etching a first portion of the low-k dielectric layer according a trench pattern formed by the first patterned feature. After etching the first portion of the low-k dielectric layer, the method may include forming a first sidewall layer on exposed sidewall surfaces of the low-k dielectric layer, the forming the first sidewall layer being performed by an first atomic layer deposition process. After forming the first sidewall layer on exposed sidewall surfaces of the low-k dielectric layer, the method may include performing a second etching of the low-k dielectric layer according to the trench pattern, the first sidewall layer protecting sidewalls of the low-k dielectric layer during the second etching of the low-k dielectric layer.

In another embodiment, another method of etching a substrate to form a trench is provided. The method may comprise providing a first patterned feature on the substrate, providing a low-k dielectric layer on the substrate, the low-k dielectric layer underlying the first patterned feature, and providing an initial sidewall layer on at least sidewalls of the first patterned feature. After providing the initial sidewall layer on at least sidewalls of the first patterned feature, the method may comprise etching a first portion of the low-k dielectric layer according a trench pattern formed by the first patterned feature. After etching the first portion of the low-k dielectric layer, the method comprises performing a cyclic process of forming sidewall layers on exposed sidewall surfaces of the low-k dielectric layer by an atomic layer deposition process and then further etching the low-k dielectric layer until the trench is formed in the low-k dielectric layer, the forming sidewall layers on exposed sidewall surfaces protecting sidewalls of the low-k dielectric layer during the further etching of the low-k dielectric layer.

In yet another embodiment a method of etching a substrate to form a trench is described. The method comprises providing a hard mask layer on the substrate and providing a first patterned feature on the substrate, the first patterned feature being located above the hard mask layer. The method further comprises providing a low-k dielectric layer on the substrate, the low-k dielectric layer being located under the hard mask layer. The method also comprises providing a first sidewall layer on at least sidewalls of the first patterned feature via a first atomic layer deposition process. After providing the first sidewall layer on at least the sidewalls of the first patterned feature, the method includes etching the hard mask layer according to a trench pattern formed by the first patterned feature, the etching the hard mask layer replicating the trench pattern in the hard mask layer and exposing sidewalls of the hard mask layer. The method further includes providing a second sidewall layer on at least the sidewalls of the hard mask layer via a second atomic layer deposition process. After providing the second sidewall layer on at least sidewalls of the hard mask layer, the method includes etching a portion of the low-k dielectric layer according to the trench pattern replicated in the hard mask layer. After etching the portion of the low-k dielectric layer, the method includes performing a cyclic process of forming sidewall layers on exposed sidewall surfaces of the low-k dielectric layer by additional atomic layer deposition processes and then further etching the low-k dielectric layer until the trench is formed in the low-k dielectric layer, the forming sidewall layers on exposed sidewall surfaces of the low-k dielectric layer protecting sidewalls of the low-k dielectric layer during the further etching of the low-k dielectric layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one embodiment etching that results in near vertical sidewalls may be accomplished through the use of an atomic layer deposition (ALD) process incorporated into the trench formation process flow. ALD processes are well known in the art and typically involve the formation of very thin layers of material on a surface. As known, exemplary ALD processes (though not all) utilize one or more reactants which react with a surface in a self-limiting (or near self-limiting) way such that layer growth on the surface is limited by atomic monolayer surface saturation of attachment molecules. Typically, two or more reactants may be utilized in a sequential manner, such that the surface is exposed to one reactant for a self-limiting reaction, then a purge occurs, then exposure to another reactant for another self-limiting reaction occurs, and then another purge occurs. This cycle may be repeated until the desired material thickness is achieved. The ALD methodology provides for repeatable, atomic-level uniformity and conformality.

In one embodiment, an atomic layer deposition (ALD) technique is used to deposit one or more layers on hard mask layers and the sidewalls of low-K dielectric trench as part of the trench etch process. The ALD layer(s) can prevent the hard mask layer(s) from being eroded during various hard mask open processes. Further, the ALD layer(s) may be utilized to prevent the low-K dielectric sidewall from being laterally etched during the low-K dielectric trench etch. Hence, better control of the trench profile and better critical dimension control may be provided. In one embodiment, the ALD layer(s) may be SiO2 or SiN sacrificial layers. In one embodiment, the hard mask for which erosion control is provided is a metal hard mask. In one embodiment, the metal hard mask is provided erosion control during the etch of an underlying hard mask, which in one embodiment may be a SiN hard mask.

The techniques disclosed herein may be utilized within a wide variety of substrate process flows. Merely for illustrative purposes, one exemplary stack of materials of a substrate for which the techniques disclosed herein may be utilized is provided with regard to the structure 100 in FIG. 1. The structure 100 of FIG. 1 may be part of any substrate for which the use of a patterned feature is desirable. For example, in one embodiment, the substrate may be a semiconductor substrate having one or more semiconductor processing layers formed thereon. In another embodiment the semiconductor substrate is a semiconductor wafer. In yet another embodiment, the substrate may have been subject to multiple semiconductor processing steps which yield a wide variety of structures and layers, all of which are known in the substrate processing art. Thus, it will be recognized that the substrate may include many additional layers and structures not shown FIG. 1. In one exemplary embodiment, the structure 100 may be used as part of a back end of line (BEOL) processing step.

Figure 1:
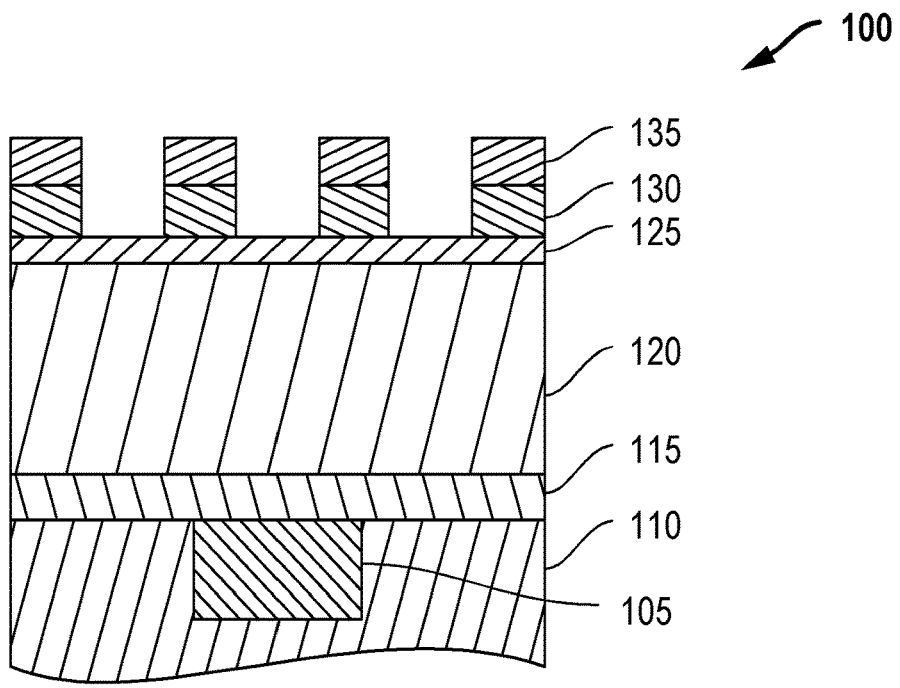
FIG. 1 illustrates a substrate structure used as part of a prior art trench formation process.
Figure 2:
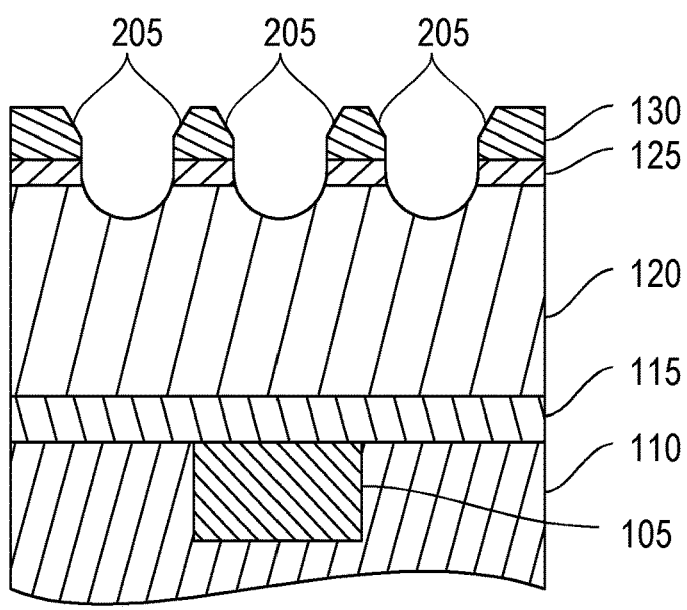
FIGS. 2-3 illustrate prior art processing results for forming a trench in the structure of FIG. 1.
Figure 3:
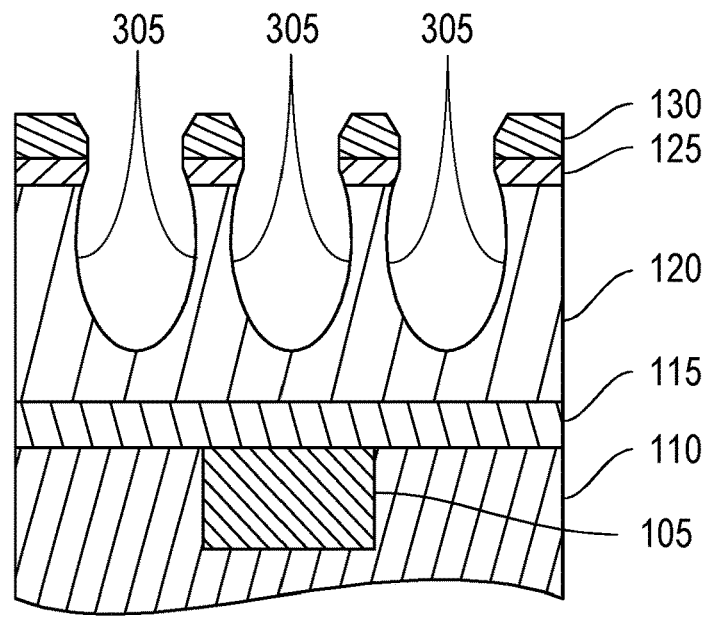
Figure 4:
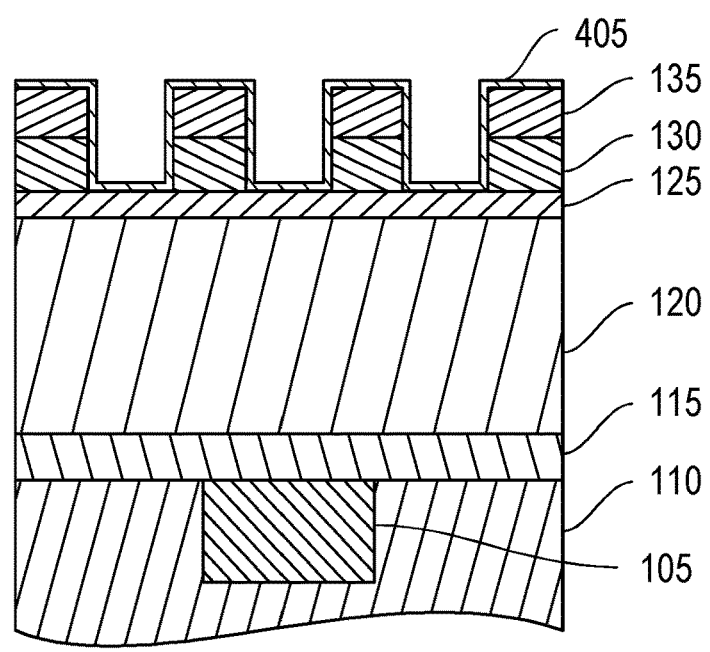
FIG. 4 illustrates the application of a first ALD layer to the structure of FIG. 1.

It will be recognized that the incorporation of an ALD process into a low-K trench formation process may be utilized with many other process flows, and particular example of FIG. 1 is merely exemplary. After formation of the structures of FIG. 1 to provide pattern features on the substrate as discussed above, an initial atomic layer deposition process may be used so that ALD layer 405 may be formed over the exposed surfaces of the substrate as shown in FIG. 4. Thus, a patterned feature sidewall layer is formed. In one embodiment, the ALD layer 405 may be a SiO2 layer. In another embodiment the ALD layer 405 may be a SiN layer. It will be recognized, however, that other ALD materials may be utilized. In one embodiment the ALD layer 405 may have thicknesses in the range of less than 10 nm and in one embodiment between 1 to 4 nm. The ALD layer 405 may be formed ex-situ in a separate process tool or may be formed in-situ in the same process tool used in conjunction with prior process steps (for example the metal hard mask layer 130 etch step) or formed in-situ in the same process tool used in conjunction with subsequent process steps (for example the lower hard mask layer 125 etch step) or in-situ with both. Thus, in one embodiment, before the lower hard mask layer 125 open step, an ALD layer 405 (in one example either SiO2 or SiN with thickness of 2 to 4 nm) is deposited on the substrate surface as shown in FIG. 4. As mentioned above, the ALD material can be formed ex-situ or in-situ.

Figure 5:
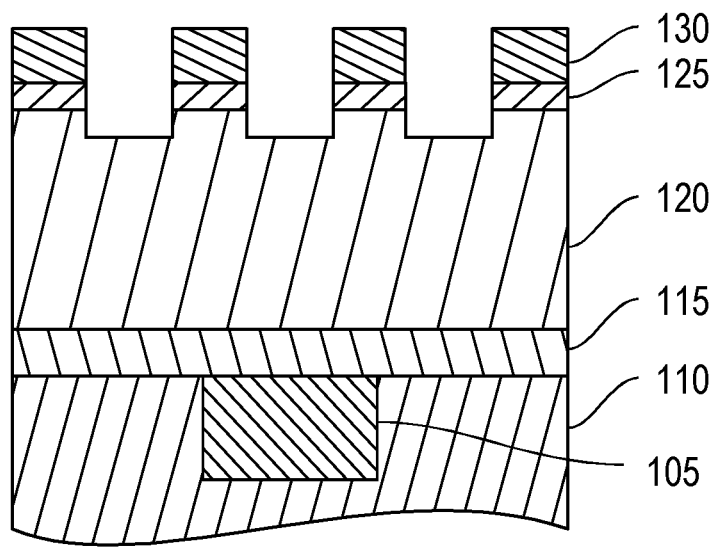
FIG. 5 illustrates the structure of FIG. 4 after etch of the lower hard mask layer.

After the ALD layer 405 is formed, as shown in FIG. 5, the lower hard mask layer 125 is etched open, exposing side walls of the hard mask and replicating the trench pattern in the lower hard mask layer 125 for transferring the trench pattern into the low-K dielectric layer 120. As shown in FIG. 5, as part of the opening of the lower hard mask layer 125, the upper hard mask layer 135 (in this example an SiO2 or SiN layer) above the metal hard mask layer 130 is removed or nearly all removed, and so is the ALD layer 405. As shown in FIG. 5, however, during the lower hard mask layer 125 etching, the corners of metal hard mask layer 130 are less eroded, hence, the trench can be better transferred with the original CD. Such metal hard mask erosion improvement results from the ALD layer 405 providing protection to the metal hard mask layer 130 due to the ALD layer 405 covering the side wall of the metal hard mask layer 130. The ALD layer 405 is sacrificed but provides protection of the sidewalls of the other layers during the metal hard mask etch. Hence, less metal hard mask is eroded (in one example less erosion of a TiN metal hard mask) and the trench CD does not change due to metal hard mask being changed, thus providing an improved replicated feature under the original pattern.

Figure 6:
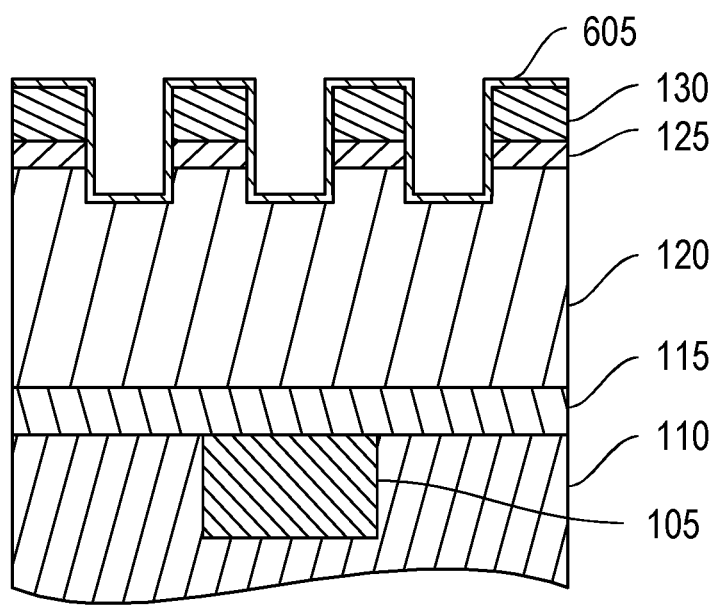
FIG. 6 illustrates the application of a second ALD layer to the structure of FIG. 5.

After the lower hard mask layer 125 etch, a second atomic layer deposition process may be used to form a second ALD layer 605 as a second sidewall layer, the second sidewall layer protecting sidewalls as shown. In one example, the second ALD layer 605 may be SiO2. In another example the second ALD layer 605 may be a SiN layer. However, it will be recognized that other ALD materials may be utilized. FIG. 6 illustrates the formation of the second ALD layer 605 post hard mask etch. Thus, as shown in FIG. 6, a second ALD layer 605 is formed on the exposed hard mask layer sidewalls and the exposed surfaces of the low-K dielectric layer 120.

Figure 7:
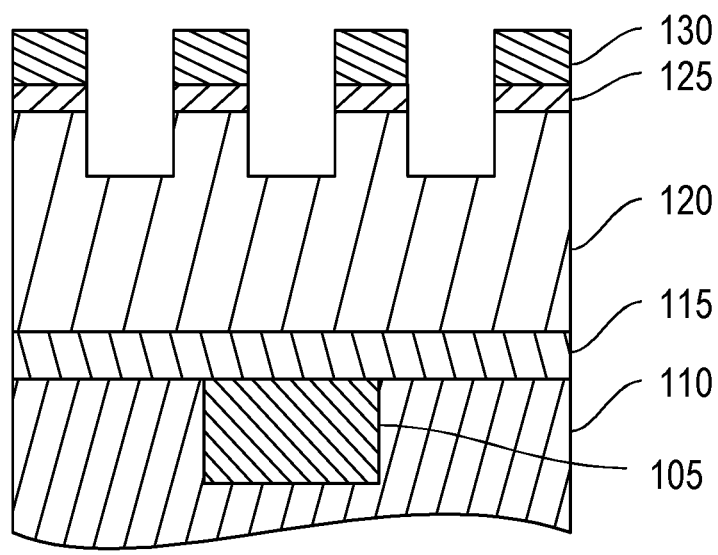
FIG. 7 illustrates the results of a low-k dielectric etch applied to the structure of FIG. 6.

Then, the low-K dielectric layer 120 is etched further to increase the trench depth. The second ALD layer 605 protects the low-K dielectric layer 120 from being laterally etched. Thus, the use of the second ALD layer 605 on the sidewall of the low-K dielectric layer 120 helps prevent bowing of the trench and damage to the low-K dielectric layer 120 sidewalls. As etching occurs, the second ALD layer 605 thickness will decrease and depending upon the particular processes and thickness involved, the second ALD layer 605 may be completely removed, thus losing the function of protection. FIG. 7 illustrates the process at this stage of time where the second ALD layer 605 has been removed.

Figure 8:
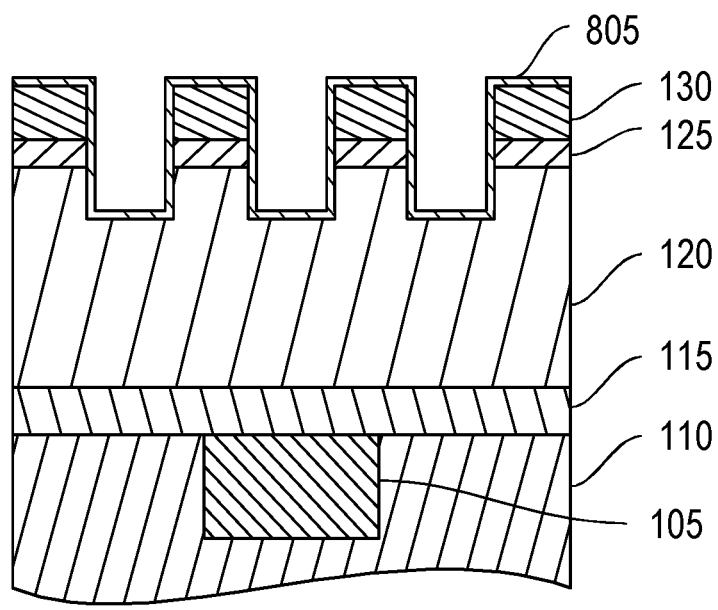
FIG. 8 illustrates the application of a third ALD layer to the structure of FIG. 7.
Figure 9:
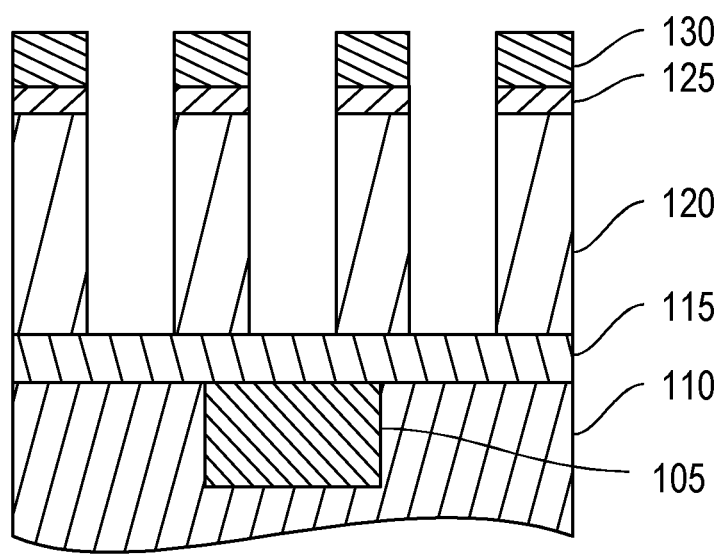
FIG. 9 illustrates the formation of a trench in the low-k dielectric layer of FIG. 8.

At this stage, a third atomic layer deposition process may be utilized so that third ALD layer 805 may be deposited on the exposed surfaces of the substrate, as shown in FIG. 8 to provide a third sidewall layer, the third sidewall layer protecting sidewalls as shown. Thus as shown, a third ALD layer has been deposited on provides protection to the exposed low-K dielectric layer and mask surfaces. Then low-K dielectric etching will be initiated again. This ALD/low-K dielectric etch cycle can be repeated multiple times until the trench depth reaches the target, for example a fourth, fifth, etc. low-K dielectric etch may be utilized. During the low-K dielectric etch process, since there are generally ALD layers on the trench bottom and sidewall, the trench profile will be straight or nearly straight, which can eliminate the formation of a bowing profile. Further the ALD layers can prevent excess lateral etching of the low-K dielectric layer 120 so that the remaining lines of low-K dielectric layer 120 will have enough thickness to prevent occurrence of line wiggling. A cyclic process of formation of ALD layers and low-K dielectric etch steps is thus described. In one embodiment, at least two cycles of the ALD formation and low-K dielectric etch steps is performed. In one preferred embodiment, these cyclical steps are performed in-situ in the same process tool, either in separate process chambers or in the same process chamber. Ultimately, the low-K dielectric layer may be completely etched back to the BLOK layer 115 as shown in FIG. 9.

At this point in the process flow, the BLOK layer 115 may be immediately etched to expose the underlying metal layer using standard techniques known in the art. Alternatively, one last ALD layer may be deposited to protect the low-K layer sidewalls during the BLOK etch similar to the techniques discussed above. In this manner, the use of the ALD layer(s) on the sidewalls of the low-K dielectric layer help provide a via through the low-K dielectric layer which does not have bowing formed during the via trench etch. The use of the ALD techniques during the formation of the trench, therefore, provides a more reliable trench structure as compared to conventional techniques.

Thus, a trench formation technique has been provided in which an ALD layer may be used to create a better controllable trench in a low-K dielectric material. The particular ALD processes utilized may be any of a wide variety of ALD processes known in the art. The process may be incorporated into standard plasma etch processes such that the ALD layer formation may be, if desired, formed in-situ with the etch processes. The process may be used with a wide variety of process tools and may be used with a wide variety of materials that are to be etched. As described herein, an ALD layer is formed before the metal hard mask etch, before the low-K layer etch and cyclically during the low-K etch process. However, it will be recognized that the formation of the ALD layer at every process step described need not be utilized in order to gain the benefits of the techniques described herein. Thus, ALD formation may occur only before the metal hard mask etch, for example. Or in another embodiment, the ALD formation may only be utilized as part of a cyclical ALD formation/low-K etch process. In yet other alternatives, other combinations of the ALD formation steps described herein may be utilized while still gaining at least some of the benefits described herein.

In one embodiment, the same material is used for all of the sidewalls formed during the cyclic process of the ALD on the low-K dielectric sidewalls and the etch of the low-K dielectric layer. In one embodiment, the same material may also be used for the ALD sidewall formed to provide protection during the hard mask open etch stop. It will be recognized, however, that various ALD layers need not be the same material. Further, a first material may be used for the protection of the low-K dielectric sidewalls while another material may be used for the protection provided during the hard mask open etch. Thus, it will be recognized that the particular process steps and materials described herein are merely exemplary and other materials and combinations may be utilized while still obtaining at least some of the advantages described herein.

It will be recognized that a wide range of ALD processes may be utilized to form the ALD layers that are used as sidewall layers as described herein. Thus, the techniques described are not limited to a particular deposition process. In one exemplary embodiment, the ALD layers may be SiO2 formed through the use of an ALD process that includes silicon (Si) precursor and oxygen (O) resource with a cyclical process of exposure of the substrate to a silicon precursor gas like silanes and then exposure to an oxidation gas like ozone (O3). Deposition is either non plasma based or plasma assisted. (for example LTO-520 (an aminosilane chemical) or Tris(dimethylamino)silane (3DMAS) or other silicon-based precursor, alternating exposure with ozone or plasma SiO2, with both components prevented from mixing. In one embodiment, ALD is a process wherein conventional chemical vapor deposition (CVD) processes are divided into separate deposition steps to construct the thin film by sequentially depositing single atomic monolayers in each deposition step. The technique of ALD is based on the principle of the formation of a saturated monolayer of reactive precursor molecules by chemisorption. A typical ALD process consists of injecting a first precursor for a period of time until a saturated monolayer is formed on the substrate. Then, the first precursor is purged from the chamber using an inert gas. This is followed by injecting a second precursor into the chamber, also for a period of time, thus forming a layer on the wafer from the reaction of the second precursor with the first precursor. Then, the second precursor is purged from the chamber. This process of introducing the first precursor, purging the process chamber, introducing the second precursor, and purging the process chamber is repeated a number of times to achieve a film of a desired thickness. It will be recognized, however, that the techniques described herein may be utilized with alternative ALD processes and equipment.

Similarly, in one exemplary embodiment, the ALD layers may be SiN formed through the use of an ALD process that includes an Si precursor and a nitrogen (N) resource with a cyclical process of exposure of the substrate to a silicon precursor gas like silanes and then exposure to an nitrogen-included gas like ammonia (NH3) with thermal or plasma activation. Deposition is either non plasma based or plasma assisted.

In one embodiment, the ALD layer may be formed via a single ALD method. In another embodiment, the ALD layer may be composed of a composite of two (or more) different layers each formed using different ALD methods to provide an ALD layer that is a composite sidewall layer. For example, in one embodiment of an ALD layer which is a composite of multiple layers, the first composite layer of the ALD method may be formed using a reactant source containing O or N (for example ozone) with a lower energy, to create a film while minimizing damage to the underlying low-k dielectric layer. Then the subsequent composite layer (s) of the ALD layer may be formed with a higher energy ALD method, such as using plasma containing O and or N to increase the deposition rate and adjust the film properties (better etch resistance, for example) than the first composite layer. In this manner, an ALD layer that is a composite of multiple layers may be formed and the first layer may be formed at lower energies than the second layer. Thus in one embodiment, a method is provided wherein at least one of the various sidewall layers are formed as a composite sidewall layer utilizing a first ALD method and a second ALD method, the first ALD method forming a lower composite sidewall layer and the second ALD method forming an upper composite sidewall layer over the lower composite sidewall layer, the first ALD method performed at a lower energy than the second ALD method. In one embodiment the lower composite sidewall layer is formed by an non-plasma ALD method and the upper composite sidewall layer is formed by a plasma ALD method.

It will also be recognized that the various etch steps described herein may be accomplished in a wide range of manners. For example, in one exemplary embodiment, the lower hard mask etch step may a plasma etch based on a carbon fluoride chemistry and the low-K dielectric etch steps may be a plasma etch based on a carbon fluoride chemistry having a lower fluorine/carbon ratio or a higher concentration of diluting gases chemistry. As mentioned, these deposition and etch examples are merely exemplary, and others may be utilized.

Figure 10:
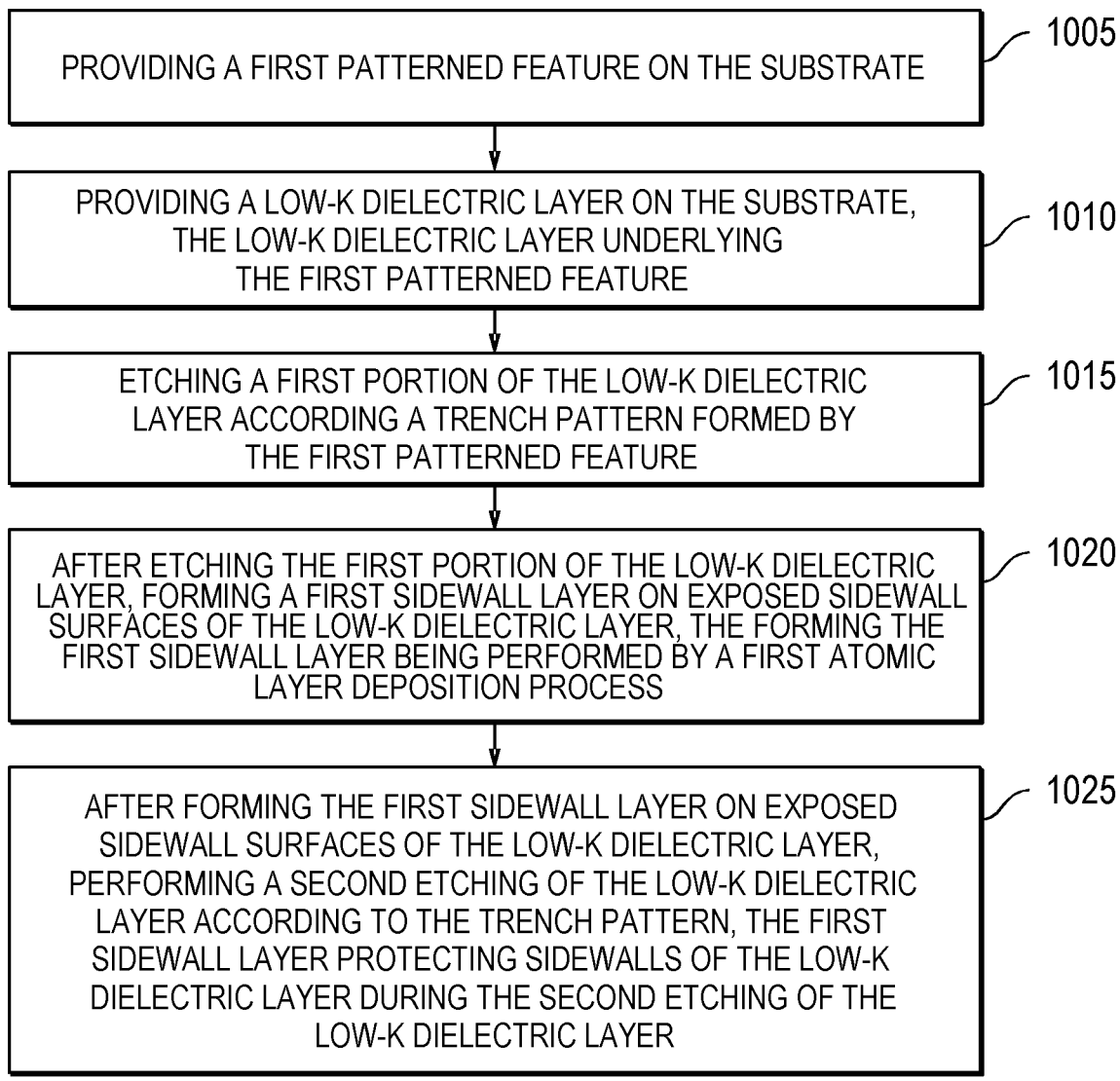
FIGS. 10, 11 and 12 illustrate exemplary flow charts for methods utilizing techniques as disclosed herein.
Figure 11:
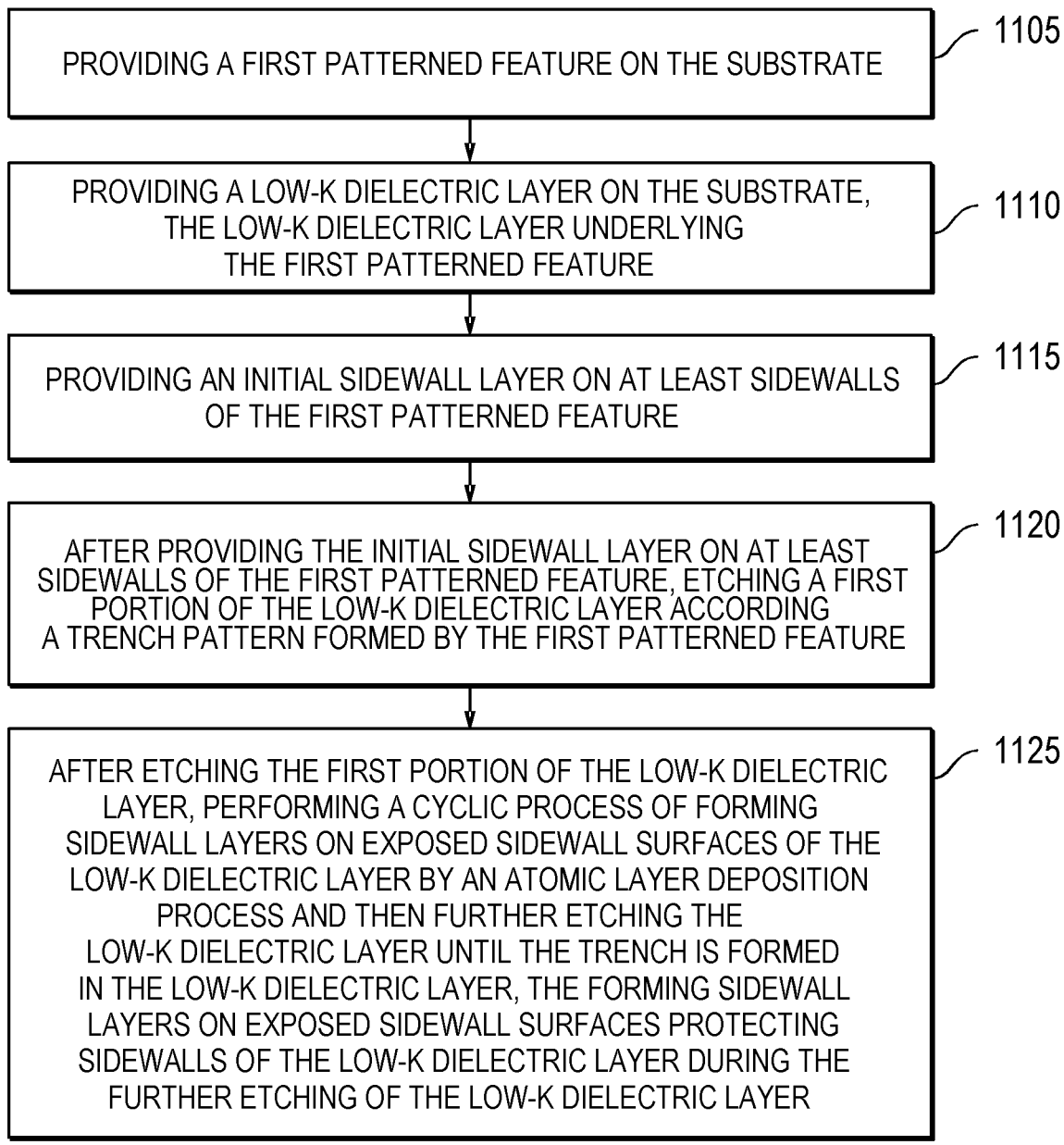
Figure 12:
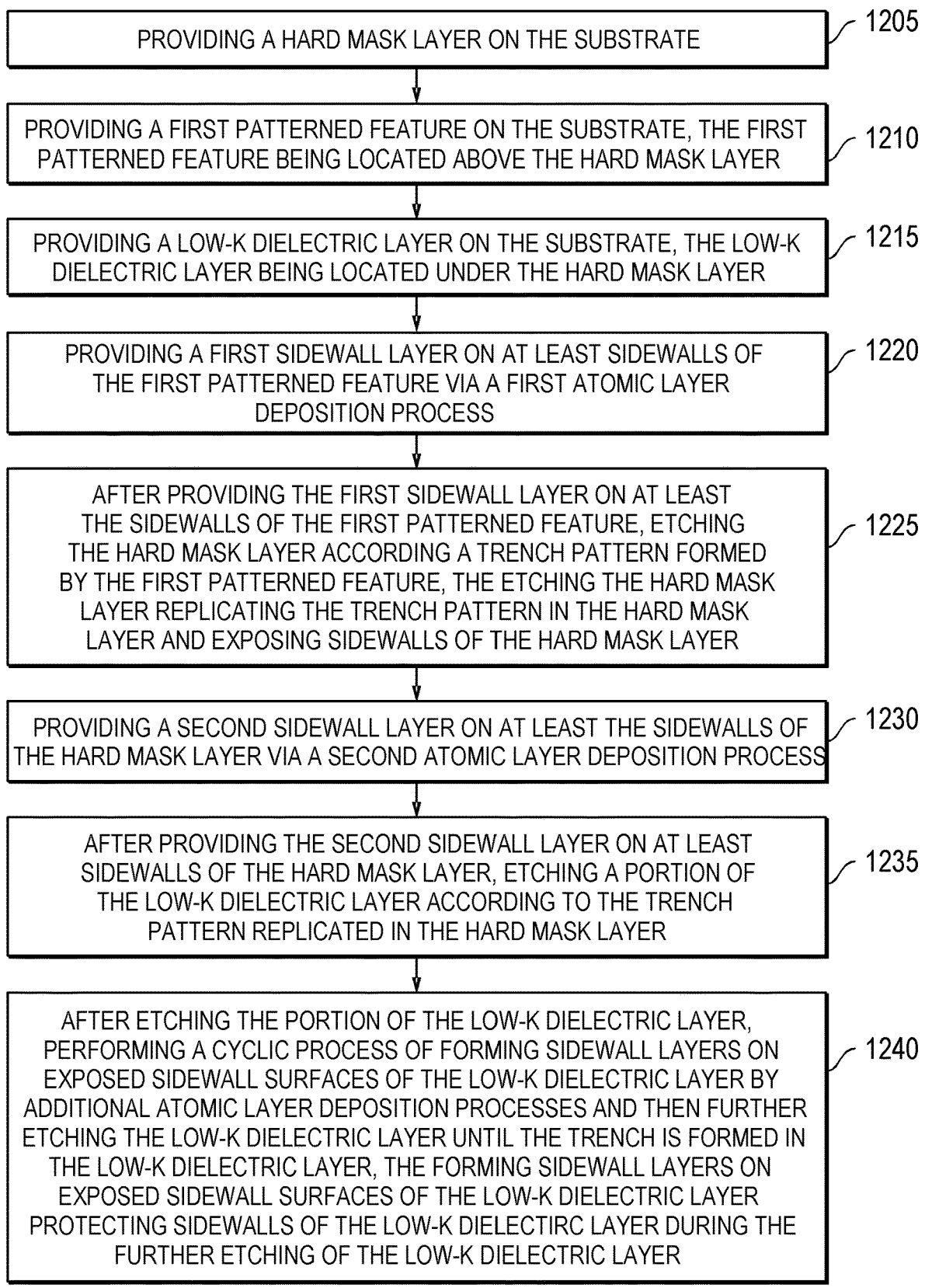

It will be recognized that the process flows described above are merely exemplary, and many other processes and applications may advantageously utilize the techniques disclosed herein. FIGS. 10-12 illustrate exemplary methods for use of the processing techniques described herein. It will be recognized that the embodiments of FIGS. 10-12 are merely exemplary and additional methods may utilize the techniques described herein. Further, additional processing steps may be added to the methods shown in the FIGS. 10-12 as the steps described are not intended to be exclusive. Moreover, the order of the steps is not limited to the order shown in the figures as different orders may occur and/or various steps may be performed in combination or at the same time.

In FIG. 10, a method of etching a substrate to form a trench is illustrated. The method includes step 1005 of providing a first patterned feature on the substrate and step 1010 of providing a low-k dielectric layer on the substrate, the low-k dielectric layer underlying the first patterned feature. The method further comprises step 1015 of etching a first portion of the low-k dielectric layer according a trench pattern formed by the first patterned feature. After etching the first portion of the low-k dielectric layer, the method includes step 1020 of forming a first sidewall layer on exposed sidewall surfaces of the low-k dielectric layer, the forming the first sidewall layer being performed by an first atomic layer deposition process. After forming the first sidewall layer on exposed sidewall surfaces of the low-k dielectric layer, the method includes step 1025 of performing a second etching of the low-k dielectric layer according to the trench pattern, the first sidewall layer protecting sidewalls of the low-k dielectric layer during the second etching of the low-k dielectric layer.

In FIG. 11, a method etching a substrate to form a trench is illustrated. The method includes step 1105 of providing a first patterned feature on the substrate and step 1110 of providing a low-k dielectric layer on the substrate, the low-k dielectric layer underlying the first patterned feature. The method further comprises step 1115 of providing an initial sidewall layer on at least sidewalls of the first patterned feature. After providing the initial sidewall layer on at least sidewalls of the first patterned feature, the method includes step 1120 of etching a first portion of the low-k dielectric layer according to a trench pattern formed by the first patterned feature. After etching the first portion of the low-k dielectric layer, the method includes step 1125 of performing a cyclic process of forming sidewall layers on exposed sidewall surfaces of the low-k dielectric layer by an atomic layer deposition process and then further etching the low-k dielectric layer until the trench is formed in the low-k dielectric layer, the forming sidewall layers on exposed sidewall surfaces protecting sidewalls of the low-k dielectric layer during the further etching of the low-k dielectric layer.

In FIG. 12, a method of etching a substrate to form a trench is illustrated. The method includes step 1205 of providing a hard mask layer on the substrate and step 1210 of providing a first patterned feature on the substrate, the first patterned feature being located above the hard mask layer. The method further comprises step 1215 of providing a low-k dielectric layer on the substrate, the low-k dielectric layer being located under the hard mask layer and step 1220 of providing a first sidewall layer on at least sidewalls of the first patterned feature via a first atomic layer deposition process. After providing the first sidewall layer on at least the sidewalls of the first patterned feature, the method includes step 1225 of etching the hard mask layer according a trench pattern formed by the first patterned feature, the etching the hard mask layer replicating the trench pattern in the hard mask layer and exposing sidewalls of the hard mask layer. The method further includes step 1230 of providing a second sidewall layer on at least the sidewalls of the hard mask layer via a second atomic layer deposition process. After providing the second sidewall layer on at least sidewalls of the hard mask layer, the method includes step 1235 of etching a portion of the low-k dielectric layer according to the trench pattern replicated in the hard mask layer. After etching the portion of the low-k dielectric layer, the method includes step 1240 of performing a cyclic process of forming sidewall layers on exposed sidewall surfaces of the low-k dielectric layer by additional atomic layer deposition processes and then further etching the low-k dielectric layer until the trench is formed in the low-k dielectric layer, the forming sidewall layers on exposed sidewall surfaces of the low-k dielectric layer protecting sidewalls of the low-k dielectric layer during the further etching of the low-k dielectric layer.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of etching a substrate to form a trench, the method comprising:
   providing a first patterned feature on the substrate;
   providing a low-k dielectric layer on the substrate, the low-k dielectric layer underlying the first patterned feature;
   etching a first portion of the low-k dielectric layer according a trench pattern formed by the first patterned feature;
   after etching the first portion of the low-k dielectric layer, forming a first sidewall layer on exposed sidewall surfaces of the low-k dielectric layer, the forming the first sidewall layer being performed by an first atomic layer deposition process;
   after forming the first sidewall layer on exposed sidewall surfaces of the low-k dielectric layer, performing a second etching of the low-k dielectric layer according to the trench pattern, the first sidewall layer protecting sidewalls of the low-k dielectric layer during the second etching of the low-k dielectric layer; and
   forming a patterned feature sidewall layer on at least sidewalls of the patterned feature, the patterned feature sidewall layer being performed by an initial atomic layer deposition process, the patterned feature sidewall layer being performed before the etching a first portion of the low-k dielectric layer.

2. The method of claim 1, wherein after the second etching of the low-k dielectric layer, forming a second sidewall layer on exposed sidewall surfaces of the low-k dielectric layer, the forming the second sidewall layer being performed by a second atomic layer deposition process.

3. The method of claim 2, wherein after forming the second sidewall layer on exposed sidewall surfaces of the low-k dielectric layer, performing a third etching of the low-k dielectric layer according to the trench pattern, the second sidewall layer protecting sidewalls of the low-k dielectric layer during the third etching of the low-k dielectric layer.

4. The method of claim 3, wherein after the third etching of the low-k dielectric layer, forming a third sidewall layer on exposed sidewall surfaces of the low-k dielectric layer, the forming the third sidewall layer being performed by a third atomic layer deposition process.

5. The method of claim 4, wherein after forming the third sidewall layer on exposed sidewall surfaces of the low-k dielectric layer, performing a fourth etching of the low-k dielectric layer according to the trench pattern, the third sidewall layer protecting sidewalls of the low-k dielectric layer during the fourth etching of the low-k dielectric layer.

6. The method of claim 5, wherein the first sidewall layer, the second sidewall layer and the third sidewall layer are formed of a same material.

7. The method of claim 6, wherein the same material is silicon oxide or silicon nitride.

8. A method of etching a substrate to form a trench, the method comprising:
   providing a first patterned feature on the substrate;
   providing a low-k dielectric layer on the substrate, the low-k dielectric layer underlying the first patterned feature;

providing an initial sidewall layer on at least sidewalls of the first patterned feature;

after providing the initial sidewall layer on at least sidewalls of the first patterned feature, etching a first portion of the low-k dielectric layer according a trench pattern formed by the first patterned feature; and after etching the first portion of the low-k dielectric layer, performing a cyclic process of forming sidewall layers on exposed sidewall surfaces of the low-k dielectric layer by an atomic layer deposition process and then further etching the low-k dielectric layer until the trench is formed in the low-k dielectric layer, the forming sidewall layers on exposed sidewall surfaces protecting sidewalls of the low-k dielectric layer during the further etching of the low-k dielectric layer.

9. The method of claim 8, wherein the initial sidewall layer on at least sidewalls of the first patterned feature and the sidewall layers on exposed sidewall surfaces of the low-k dielectric layer are formed of a same material.

10. The method of claim 8, wherein the initial sidewall layer on at least sidewalls of the first patterned feature and the sidewall layers on exposed sidewall surfaces of the low-k dielectric layer are formed of silicon oxide or silicon nitride.

11. The method of claim 8 wherein at least two cycles of the cyclic process occur.

12. The method of claim 11, wherein the sidewalls formed during the cyclic process are all formed of a same material.

13. The method of claim 12, wherein the same material is silicon oxide or silicon nitride.

14. A method of etching a substrate to form a trench, the method comprising:
providing a hard mask layer on the substrate;
providing a first patterned feature on the substrate, the first patterned feature being located above the hard mask layer;
providing a low-k dielectric layer on the substrate, the low-k dielectric layer being located under the hard mask layer;
providing a first sidewall layer on at least sidewalls of the first patterned feature via a first atomic layer deposition process;
after providing the first sidewall layer on at least the sidewalls of the first patterned feature, etching the hard mask layer according to a trench pattern formed by the first patterned feature, the etching the hard mask layer replicating the trench pattern in the hard mask layer and exposing sidewalls of the hard mask layer;
providing a second sidewall layer on at least the sidewalls of the hard mask layer via a second atomic layer deposition process;
after providing the second sidewall layer on at least sidewalls of the hard mask layer, etching a portion of the low-k dielectric layer according to the trench pattern replicated in the hard mask layer; and
after etching the portion of the low-k dielectric layer, performing a cyclic process of forming sidewall layers on exposed sidewall surfaces of the low-k dielectric layer by additional atomic layer deposition processes and then further etching the low-k dielectric layer until the trench is formed in the low-k dielectric layer, the forming sidewall layers on exposed sidewall surfaces of the low-k dielectric layer protecting sidewalls of the low-k dielectric layer during the further etching of the low-k dielectric layer.

15. The method of claim 14, wherein the trench aligns with a metallization layer.

16. The method of claim 14, wherein the sidewall layers on exposed sidewall surfaces of the low-k dielectric layer are all formed of a first material.

17. The method of claim 16, wherein the first material is $SiO_2$ or SiN.

18. The method of claim 17, wherein the first sidewall layer and the second sidewall layer are both formed of the first material.

19. The method of claim 14, wherein at least one of the first sidewall layer, the second sidewall layer, or the sidewall layers on exposed sidewall surfaces of the low-k dielectric layer are formed as a composite sidewall layer utilizing a first ALD method and a second ALD method, the first ALD method forming a lower composite sidewall layer and the second ALD method forming an upper composite sidewall layer over the lower composite sidewall layer, the first ALD method performed at a lower energy than the second ALD method.

* * * * *